United States Patent [19]
Gaughan et al.

[11] Patent Number: 5,530,363
[45] Date of Patent: Jun. 25, 1996

[54] DC GROUND FAULT DETECTING APPARATUS WITH AN AUTO-NULL CIRCUIT AND METHOD

[75] Inventors: John Gaughan, 45 Davis Ave., New Rochelle, N.Y. 10805; Robert G. Ward, Lake Grove, N.Y.

[73] Assignees: John Gaughan, New Rochelle, N.Y.; Consolidated Edison Company of New York, Inc., New York, N.Y.

[21] Appl. No.: 331,672

[22] Filed: Oct. 31, 1994

[51] Int. Cl.⁶ .................................................. G01R 31/02
[52] U.S. Cl. .................. 324/509; 324/529; 324/551; 324/117 H; 340/650; 361/42
[58] Field of Search ................... 324/509, 510, 324/511, 527, 528, 529, 541, 544, 551, 117 H; 340/649, 650; 361/42, 49

[56] References Cited

U.S. PATENT DOCUMENTS

| | | | |
|---|---|---|---|
| 3,274,489 | 9/1966 | Behr | 324/529 X |
| 3,757,169 | 9/1973 | Beresnikow | 361/49 |
| 4,528,497 | 7/1985 | Arato | 340/651 X |
| 4,739,274 | 4/1988 | Kimball et al. | 324/529 |
| 4,739,275 | 4/1988 | Kimball et al. | 324/529 |
| 4,837,519 | 6/1989 | Lopetrone et al. | 324/529 |
| 4,884,034 | 11/1989 | Guzman | 324/529 |
| 4,929,901 | 5/1990 | Kimball et al. | 324/529 |
| 5,363,047 | 11/1994 | Dresti et al. | 324/510 |

*Primary Examiner*—Kenneth A. Wieder
*Assistant Examiner*—Diep Do
*Attorney, Agent, or Firm*—Brooks Haidt Haffner & Delahunty

[57] ABSTRACT

To locate ground faults in a normally ungrounded DC circuit a centertapped voltage divider is connected across the positive and negative buses. An oscillator controlled switch is connected between the centertap and ground which when operating modulates the ground fault currents with a square wave having a repetition rate no greater than 3 hertz. A Hall probe including a field nulling coil is clamped successively along the conductors under test. A capacitive storage circuit maintains the energization of the nulling coil at the level that provided a null indication immediately prior to actuation of a test button. The Hall probe is connected to a read-out oscilloscope which indicates the presence or absence of the square wave modulation. Fault currents as small as 1 ma can be detected.

12 Claims, 3 Drawing Sheets

DC GROUND FAULT DETECTING APPARATUS WITH AN AUTO-NULL CIRCUIT AND METHOD

The present invention relates to ground fault detection and, more particularly, to the location of ground faults in normally ungrounded DC circuits.

Ungrounded DC circuits are used for control and supervision in electric power generating substations. As a result of aging or moisture or both, ground faults develop. These ground faults, i.e., stray grounds, degrade the performance and reliability of critical components of the control and supervision system.

The supervisory and control systems are critical for the protection and operation of a substation. These circuits are normally powered by ungrounded DC sources, typically at the 48 and 125 volt level. Since the circuits are floating, they can operate with multiple, unintentional ground faults of varying impedances. However, such faults, also referred to as stray grounds, can degrade the performance and reliability of vital substation equipment. For example, a low resistance ground may form a path around a relay coil that could shunt enough current to prevent tripping of the relay. Consequently, methods to detect ground faults are normally designed into the DC systems. Maintenance procedures call for the elimination of any detected grounds as quickly as practicable.

In a typical substation, each DC system has a DC ammeter connected from ground to the midpoint or centertap of a resistor or resistor divider connected across the positive and negative buses. A stray ground causes current to flow through the meter. When current levels through the meter exceed ±5 ma, action is taken by the substation attendants to locate and eliminate the ground faults.

It is not uncommon in older substations to find station control cables running in trenches and trays above and below ground where, because of age, congestion, or poor drainage, stray grounds frequently develop. It is not uncommon to have multiple ground faults on a DC system and in some older stations up to twenty have existed at the same time.

Prior to the present invention it took a two man crew anywhere from several hours to several days to locate and clear a single ground fault. The established procedure involved isolating the various branch circuits one by one by opening breakers at the DC load board and looking for changes in the ground current level as measured by the meter mentioned above. Re-energization of the branch circuits causes an inductive spike which can in some circumstances activate protective relays. Some sensitive auxiliary relays, particularly those now being developed with solid state controls, are especially susceptible to this problem.

Once a suspect branch circuit is identified, the ground fault must be further isolated by working down the deenergized circuit disconnecting leads and making resistance measurements until the location is determined. Often the circuit runs for hundreds of feet through various panels and cubicles. Consequently, there is a practical limitation as to when troubleshooting for ground faults can be initiated.

SUMMARY OF THE INVENTION

To overcome the above disadvantageous procedure is, therefore, an object of the present invention. It is another object to provide a reliable non-intrusive apparatus and method for locating ground faults in a normally ungrounded DC system.

A further object of the present invention is to provide a non-intrusive system capable of detecting ground fault currents in the aforementioned circuits, the magnitude of which is no greater than 5 ma, and preferably as little as 1 to 2 ma.

In accordance with one aspect of the present invention, there is provided apparatus for locating ground faults in a normally ungrounded DC circuit having a positive and a negative supply bus, the apparatus comprising a center-tapped resistive voltage divider connected across the supply buses. Means are connected between the centertap and ground for alternatingly connecting and disconnecting the centertap to and from ground at a predetermined rate. Additional means are provided for detecting the presence of current perturbations at selectable locations in conductors of the circuit which perturbations occur at the predetermined rate.

In accordance with another aspect of the present invention there is provided a method for locating ground faults in a normally ungrounded DC circuit having a positive and a negative supply bus which method comprises providing a centertapped voltage divider connected across the buses with a path for current to flow between the centertap and ground. The current flowing in the path is modulated with a signature signal having a predetermined repetition rate no greater than 3 hertz. Thereafter the locations are determined along conductors of the circuit where the signature signal at the predetermined rate can be detected.

BRIEF DESCRIPTION OF THE DRAWINGS

The invention will be better understood after reading the following detailed description with reference to the appended drawings in which.

Throughout the drawings the same reference numerals are used to designate the same or similar parts.

DESCRIPTION OF THE PRESENTLY PREFERRED EMBODIMENT

Figure 1:
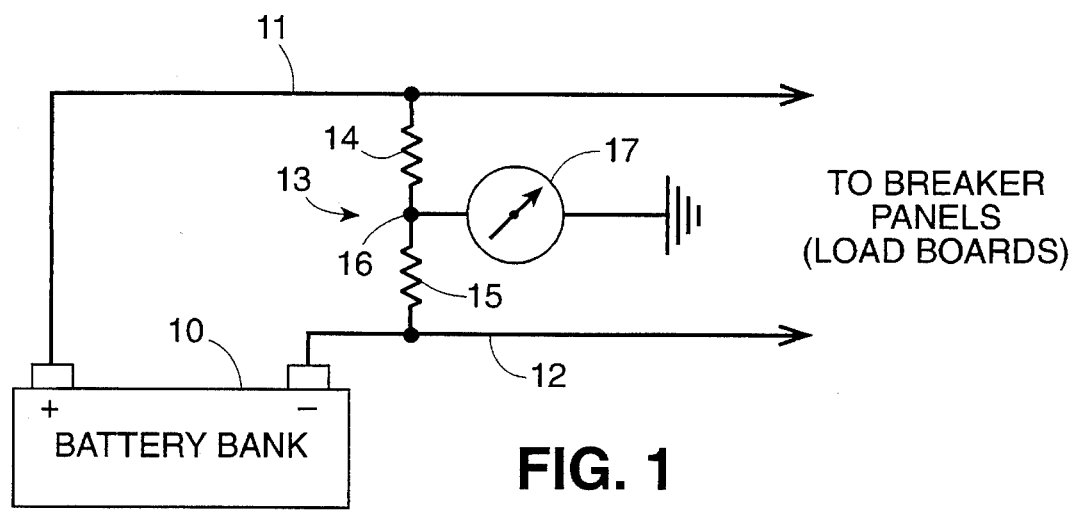
FIG. 1 is a schematic diagram showing a typical arrangement heretofore employed for the detection of ground fault currents in an ungrounded DC circuit.

Referring to FIG. 1 there is shown the basic elements of a typical ungrounded DC circuit employed in an electric power substation. A battery bank 10 supplies current to breaker panels and the like over a positive supply bus 11 and a negative supply bus 12. In order to detect the presence of ground faults that occur along buses 11 and 12 there is connected across the buses a voltage divider 13 consisting of two equal value resistors 14 and 15 joined to each other at a centertap 16. A DC milliammeter 17 is connected between the centertap 16 and ground. Whenever one of the buses develops a ground fault, current will flow through the meter 17, and when this current reaches some preselected value, for example 5 ma, it is recognized that action must be taken to eliminate the fault or faults.

Figure 2:
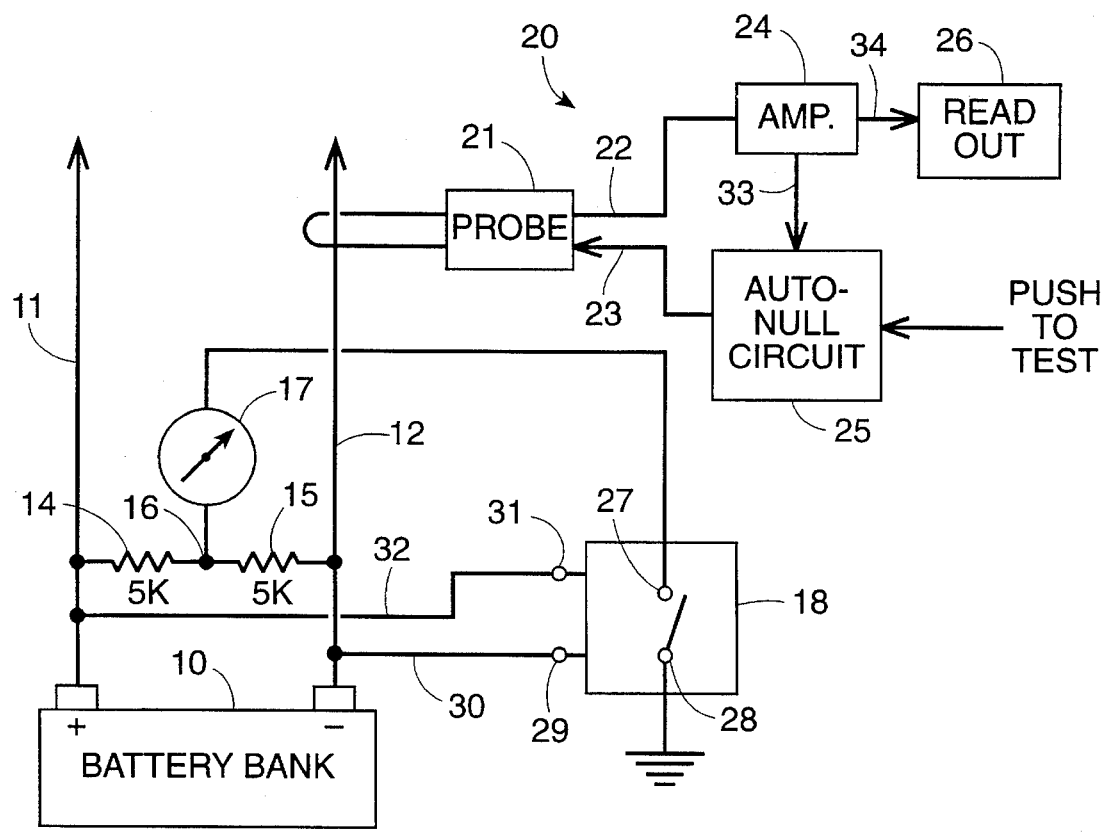
FIG. 2 is a schematic diagram showing the basic components of an embodiment of the present invention as applied to the circuit of FIG. 1.

Referring now to FIG. 2, there is shown a circuit including a signature signal developing switch 18 having an output terminal 27 connected to the meter 17 and an output terminal 28 connected to ground whereby the switch 18 is connected in series with the meter 17 between the centertap 16 and ground. The switch 18 is also provided with input terminals 29 and 31 which are connected, respectively, by leads 30 and 32 to buses 12 and 11 from which operating voltage is obtained. The switch 18 is constructed to operate at a very slow rate below 5 hertz, and preferably below 3 hertz, for alternatingly connecting and disconnecting the centertap 16 to and from ground. Such operation of switch 18 imposes a substantially square wave modulation on any ground current otherwise flowing between centertap 16 and ground.

With the switch 18 operating, a probe circuit designated generally by the reference numeral 20 is used to scan the various conductors of the DC circuit to locate where perturbations are detected having the general waveform and repetition rate of the signature signal. The probe circuit consists of a clamp-on Hall probe 21 of known construction having an output 22 and an input 23. The output 22 feeds an amplifier 24 having an output 33 connected to an Auto-Null Circuit 25 and an output 34 connected to a read-out device 26. The Auto-Null Circuit 25 also has an output coupled to the input 23 of the probe 21. A "push to test" input is supplied to the Auto-Null circuit 25 when it is desired to commence a test.

Figure 3:
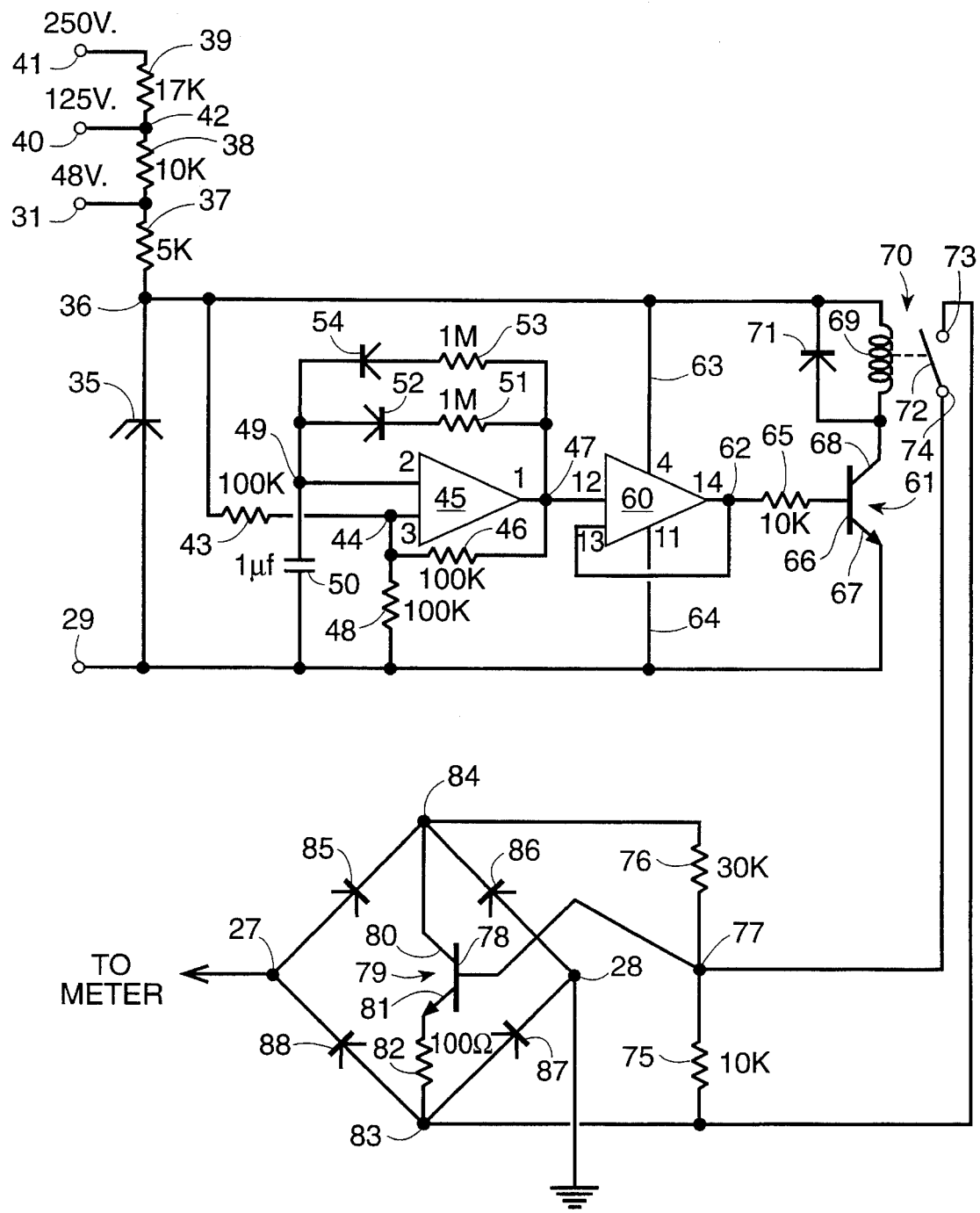
FIG. 3 is a schematic diagram showing the construction of the circuit modulating switch of FIG. 2.

The details of construction of the switch 18 will now be described with reference to FIG. 3 to which attention should now be directed. As seen in FIG. 3, the input terminal 29 is connected to one side of a voltage stabilizing semiconductor diode 35, the other side of which is connected at a junction 36 through a 5K resistor 37 to the input terminal 31. The terminal 31 is designated as a 48 volt tap on the assumption that the battery bank 10 supplies 48 volts to the buses 11 and 12. However, other commonly encountered DC voltage supplies may provide an output at either 125 volts or 250 volts. To accommodate these higher voltages, a voltage divider is provided including a 10K resistor 38 and a 17K resistor 39 that are connected in series with resistor 37. Additional input terminals 40 and 41 are provided for voltage supplies of 125 V. and 250 V., respectively. The terminal 40 is connected to the junction 42 between resistors 38 and 39 while the terminal 41 is connected to the free end of resistor 39.

Junction 36 is also connected through a 100K resistor 43 to one input terminal, 44, of an operational amplifier 45. A 100K resistor 46 connects the output terminal 47 of amplifier 45 back to the input terminal 44 which is also connected by another 100K resistor, 48, to the terminal 29. The operational amplifier 45 has a second input terminal, 49, connected by a 1 µf capacitor 50 to terminal 29. Between terminals 49 and 47 are connected a 1M resistor 51 in series with a semiconductor diode 52 in parallel with a series connection of a 1M resistor 53 and a semiconductor diode 54. The operational amplifier 45 in conjunction with the components coupled to its input terminals 44 and 49 functions as an extremely low frequency oscillator. With the operational amplifier 45 selected as one half of a type LM124, the circuit oscillates at about 0.66 Hz developing a square wave signal at its output terminal 47 which signal is "ON" for approximately 750 ms and "OFF" for approximately the same length of time.

The other half of the type LM124 device is shown at 60 where it is connected to operate as an isolator driver for a transistor 61. For this purpose the output terminal 47 of amplifier 45 is connected to one input of the operational amplifier 60 while the second input of the amplifier 60 is directly connected to its output terminal 62. Connections 63 and 64 connect junction 36 and terminal 29, respectively, to the operational amplifiers 45 and 60 for supplying operating voltage thereto.

Output terminal 62 of amplifier 60 is connected through a 10K resistor 65 to the base electrode 66 of transistor 61. The emitter electrode 67 of transistor 61 is connected to terminal 29 while the collector electrode 68 of transistor 61 is connected through the coil 69 of a reed relay 70 to junction 36. A damping semiconductor diode 71 is connected in shunt to the coil 69.

The switch 72 forming a part of relay 70 has its terminals 73 and 74 connected across a 10K resistor 75 which constitutes one leg of a voltage divider, the other leg being a 30K resistor 76. The junction 77 between resistors 75 and 76 is connected to the base electrode 78 of a transistor 79 whose collector electrode 80 is connected at a junction 84 to the free end of resistor 76. The emitter electrode 81 of transistor 79 is connected through a 100 ohm resistor 82 to a junction 83 which is connected to the junction between resistor 75 and relay terminal 73. The circuit through the transistor 79 and resistor 82 between junctions 83 and 84 constitutes one diagonal of a bridge circuit consisting of four semiconductor diodes, 85, 86, 87 and 88, each in a separate arm of the bridge. The other diagonal of the bridge extends between terminals 27 and 28 and provides the output of the switching circuit 18.

The operation of the system shown in FIGS. 2 and 3 will now be described. During normal operation the relay 70 will be in the open circuit condition as shown in FIG. 3 such that the transistor 79 will be rendered conductive between junctions 83 and 84 whenever any significant voltage is applied between terminals 27 and 28 due to ground faults along buses 11 and/or 12. That is, a path for ground fault current, depending upon its polarity, is provided from the centertap 16 through meter 17, either diode 85 or 88, transistor 79, and the appropriate diode 87 or 86 to ground via terminal 28. Upon indication by meter 17 of ground fault current in excess of some predetermined magnitude, e.g., 1 ma, an operator will activate the signature signal generator 18. Such actuation can be accomplished by closing an appropriate switch (not shown) in the power supply circuitry to the signal generator 18. Operation of the generator 18 will cause the relay 70 to cycle between closed and opened condition at the 0.66 Hz rate thereby rendering transistor 79 alternately non-conductive and conductive to superimpose on the already present fault current a square wave modulation.

The probe 21 which is hand held is then sequentially clamped by an operator to each wire leaving the main breaker panel until the superimposed signature signal is identified on the oscilloscope read-out device 26. This signifies a fault on that wire or branch. The operator then follows the fault branch or wire until a point is reached where the signature signal disappears. At this point the operator has either located the fault or the fault is located down a branch that was just passed. If the fault is found to be down another branch, that branch is scanned by sequentially clamping the probe 21 therealong until the fault is found. If multiple faults are identified, the fault located furthest down the branch must be cleared first, and so on until all faults are cleared.

One obstacle to detecting fault currents as little as 1 ma is due to the fact that nominal DC load current flowing in a branch circuit may reach 10 to 20 amperes while the fault current is on the order of a few milliamperes. To increase sensitivity of the probe circuit 20 there is incorporated the Auto-Null Circuit 25, described in detail below. The circuit 25 generates a reverse current component which when passed through windings in the hand held probe 21 effectively nulls out any quiescent current in the system. This allows the amplifier 24 and read-out oscilloscope 26 to be operated at very high levels of gain and sensitivity permitting observance of very small changes, as little as 1 ma, in the high total current carried by the branch or wire to which the probe 21 is clamped.

Figure 4:
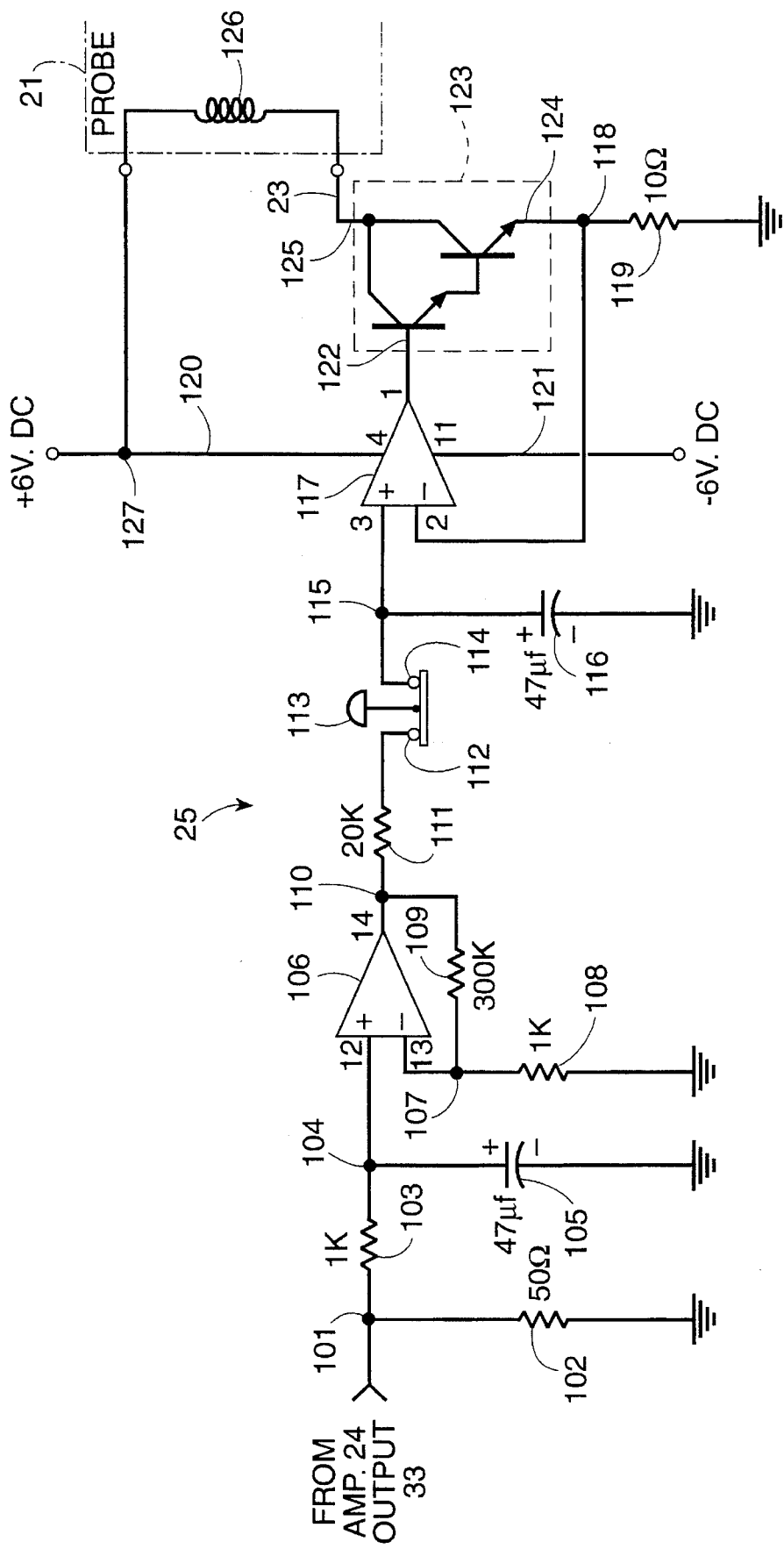
FIG. 4 is a schematic diagram showing the construction of the auto-null circuit of FIG. 2.

Reference should now be had to FIG. 4. The output 33 from the amplifier 24 is connected at a junction 101 through a 50 ohm resistor 102 to ground and through a 1K resistor 103 to a junction 104. A 47 µf capacitor 105 is connected between the junction 104 and ground while the junction 104 is also connected to the (+) input terminal of an operational amplifier 106 whose (−) input is connected to a junction 107 between a 1K resistor 108 and a 300K resistor 109. The resistor 108 is connected between junction 107 and ground while the resistor 109 is connected between the output terminal 110 of the amplifier 106 and the junction 107. The operational amplifier 106 is one half of a type LM124 device.

The output of amplifier 106 at junction 110 is also connected through a 20K resistor 111 to a terminal 112 of a normally closed, push-to-open, switch 113 having a second terminal, 114, connected to a junction 115. The junction 115 is connected to ground through a 47 µf capacitor 116 and to the (+) input of an operational amplifier 117. Amplifier 117 is provided by the second half of the LM124 device of which amplifier 106 is the other half.

The (−) input of the amplifier 117 is connected through a junction 118 and a 10 ohm resistor 119 to ground. A source of operating voltage is provided for the operational amplifiers 106 and 117 by a connection 120 from a +6 volt DC supply and by a connection 121 from a −6 volt DC supply.

It should be understood that the small numbers located adjacent the triangle symbols for the operational amplifiers are the pin numbers of the type LM124 device identifying the various input and output terminals of the actual device.

As seen in FIG. 4, the output from the amplifier 117 is connected to the input terminal 122 of a Darlington amplifier 123, type TIP122. The output terminal 124 of the Darlington amplifier 123 is connected to the junction 118, while the terminal 125 is connected through lead 23 and a coil 126 to the ±6 volt DC supply at a junction 127. The coil 126 has 30 turns and is located on the Hall probe 21 poled to develop a magnetic field of opposite polarity to that encountered by the Hall probe due to current flowing in the conductor about which the probe is clamped.

The Auto-Null Circuit operates in the following manner. When the Hall probe 21 is clamped about a conductor, the magnetic field surrounding the conductor, due to current flowing through the conductor, will cause a significant output signal to appear at the outputs 33 and 34 of the amplifier 24. However, with the switch 113 closed the capacitor 116 will be rapidly charged by the signal which is further amplified by amplifier 106. The potential developed across capacitor 116 will be proportional to the intensity of the magnetic field sensed by the Hall probe 21.

The amplifier 117, while providing isolation for the capacitor 116, drives the Darlington amplifier 123 which controls the current through the coil 126. The components are proportioned such that the magnetic field developed by the coil 126 will substantially null out or cancel the field otherwise around the conductor due to the existing DC current in the circuit under test. The read-out device 26 (oscilloscope) will provide zero or near zero indication even as the gains of the amplifier 24 and of the read-out device 26 are increased to maximum sensitivity. Of course, a short interval will pass from the moment the probe is clamped about a conductor until the charge on capacitor 116 peaks out and the read-out indication approaches zero. Once a steady condition is reached, the push-to-test button 113 is pressed to disable the auto-null function. The charge on the capacitor 116 at the instant switch 113 is operated will be retained thereby maintaining nulling current through the coil 126. The system will remain essentially nulled except for any changes which occur after the button is depressed. So long as the switch 113 is held in the open circuit condition, the read-out device 26 will provide indications sufficient to be observed by the human eye. As a result of testing it has been determined that fault currents as small as 1 ma can be observed.

The following table provides additional identifying information for the various components not presented in the drawings.

| Part Number | Identification |
| --- | --- |
| Diode 35 | IN4742A |
| Diodes 52, 54 | IN640 |
| Diodes 71, 85–88 | IN4007 |
| Transistor 61 | 2N2222 |
| Transistor 79 | MJG340 |
| Reed Relay 70 | C.P. Clare D2241A12 12 V w/3K coil |
| Capacitor 50 | 30 V. 1 µf |
| Capacitors 105, 116 | 20 V. 47 µf |
| Resistors 37–39, 76 | 2 Watt |
| Resistors 75, 82, 103, 108, 109, 111 | ½ Watt |
| Resistor 119 | 5 Watt wire wound |
| Probe 21 | Tektronix A6302 or A6303 |
| Amplifier 24 | Tektronix AM503 |
| Read Out 26 | Tektronix Type 323 oscilloscope |

The advantages of the system described above are manifold. Since the frequency of the superimposed signature signal is so low, any capacitance in the system is charged and minimum AC current is introduced. The minimum fault current that can be detected is less than 1 ma. The method is non-intrusive, portable, easy to use, and does not jeopardize system integrity by introducing additional current into the system. The system is so accurate that a fault can be located to an accuracy of less than one inch.

Having described the present invention with reference to the presently preferred embodiment thereof, it should be understood that various changes in details of construction and performance of the method can be introduced as will be apparent to those skilled in the subject art without departing from the true spirit of the invention as defined in the appended claims.

What is claimed is:

1. Apparatus for locating ground faults in a normally ungrounded DC circuit having a positive and a negative supply bus, said apparatus comprising a centertapped resistive voltage divider connected across said supply buses, means connected between said centertap and ground for alternatingly connecting and disconnecting said centertap to and from ground at a predetermined rate, and means for detecting the presence of current perturbations at selectable locations in conductors of said circuit which perturbations occur at said predetermined rate, said means for detecting current perturbations comprising a clamp-on magnetic field probe having an output coupled to an indicating device, and an automatically operative magnetic field canceling device coupled to said probe, whereby at least as little as 5 ma ground fault current flowing through said buses is detectable.

2. Apparatus according to claim 1, wherein said means connected between said centertap and ground comprises: an oscillator; a relay; and a bridge circuit; said bridge circuit having a first diagonal connected between said centertap and ground, and a second diagonal coupled to an output of said relay; and said oscillator having an output coupled to an input of said relay.

3. Apparatus according to claim 2, wherein said oscillator is constructed to provide a relay actuating signal at said oscillator output alternating at a rate no greater than 3 hertz.

4. Apparatus according to claim 3, wherein said alternating rate of said oscillator is on the order of ⅔ hertz.

5. Apparatus according to claim 2, wherein said bridge circuit consists of four arms each containing a unidirectionally conductive device, and said second diagonal is interconnected by a controllable unidirectionally conductive semiconductor device having a controlling input coupled to said relay output.

6. Apparatus according to claim 5, wherein said oscillator is constructed to provide a relay actuating signal at said oscillator output alternating at a rate no greater than 3 hertz.

7. Apparatus according to claim 6, wherein said alternating rate of said oscillator is on the order of ⅔ hertz.

8. Apparatus according to claim 1, wherein said means for detecting current perturbations is constructed to detect as little as 1 ma ground fault current flowing through said buses.

9. Apparatus according to claim 1, wherein said magnetic field canceling device comprises an auxiliary coil disposed on said probe, means for energizing said auxiliary coil with a current proportional to a signal obtained from said probe, said auxiliary coil being poled to produce a magnetic field to oppose the magnetic field produced by the current in the conductor to which said probe is to be applied.

10. Apparatus according to claim 9, wherein said probe comprises a Hall probe.

11. Apparatus according to claim 10, wherein said means for energizing said auxiliary coil comprises charge storage means coupled through an amplifier to an output of said probe for storing a voltage proportional to the amplified output of said probe when said probe is clamped about one of said conductors, means coupling said charge storage means to said auxiliary coil for determining the magnitude of the current supplied to said auxiliary coil for energizing said auxiliary coil, and means for isolating said charge storage means from said amplified output of said probe to maintain a constant energization of said auxiliary coil thereby enabling said indicating device to detect perturbations due to ground fault currents no greater than 5 ma.

12. Method for locating ground faults in a normally ungrounded DC circuit having a positive and a negative supply bus, said method comprising in combination the steps of providing a centertapped voltage divider connected across said buses, providing a path for current to flow between said centertap and ground, modulating current flowing in said path with a signature signal having a predetermined repetition rate no greater than 3 hertz by opening and closing said path to superimpose a square wave modulation on ground fault currents flowing through said buses, and determining the locations along conductors of said circuit where said signature signal at said predetermined rate can be detected by applying about a conductor in said DC circuit a clamp-on Hall probe with an auxiliary field bucking coil, supplying said field bucking coil with a current that at any instant is proportional to an amplified output from said Hall probe for energizing said field bucking coil to produce a bucking field of opposite polarity and substantially equal magnitude to the magnetic field surrounding said conductor in the absence of said bucking field, and at a selected instant freezing said current supplied to said bucking coil at the level prevailing at said instant, and thereafter determining the presence or absence of said signature signal.

* * * * *